(12) United States Patent
Arai et al.

(10) Patent No.: US 6,388,341 B2
(45) Date of Patent: May 14, 2002

(54) SEMICONDUCTOR DEVICE

(75) Inventors: Fumitaka Arai; Yuji Takeuchi, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/835,380

(22) Filed: Apr. 17, 2001

(30) Foreign Application Priority Data

Apr. 17, 2000 (JP) ........................................ 2000-115120

(51) Int. Cl.$^7$ .............................................. H01L 23/544
(52) U.S. Cl. .......................... 257/797; 257/798; 438/401
(58) Field of Search ................................. 257/797, 798; 438/462, 975, 401

(56) References Cited

FOREIGN PATENT DOCUMENTS

JP        2000-114258        4/2000

*Primary Examiner*—David Nelms
*Assistant Examiner*—Andy Huynh
(74) *Attorney, Agent, or Firm*—Oblon, Spivak, McClelland, Maier & Neustadt, P.C.

(57) ABSTRACT

In a semiconductor device comprising patterns Pa1 through Pa3 which include (n+1) patterns (n is a natural number) for alignment arranged in a first direction which corresponds to a reading direction in pattern recognition, and patterns Pc1 formed in a mark proximity region Rc1, which include at least two patterns in at least the first direction, defining the pitches between the patterns Pa1 and Pa2 and between Pa2 and Pa3 as d1 and d2, respectively, defining the pitch between the patterns Pc1 in the first direction as dD, and defining the distance from the pattern Pa1 to the outside edge of the mark proximity region Rc1 as D, then, the dD is set so as to satisfy the relational expressions $|(dD-d1)/d1| \geq \alpha$ and $|(dD-d2)/d2|\alpha(1>\alpha>0)$ in the mark proximity region Rc1 in which at least $D \leq d1+d2$ is satisfied.

21 Claims, 8 Drawing Sheets

SEMICONDUCTOR DEVICE

CROSS REFERENCE TO RELATED APPLICATION

This application claims benefit of priority under 35 USC §119 to Japanese patent application No.2000-115120, filed on Apr. 17, 2000, the contents of which are incorporated by reference herein.

BACKGROUND OF THE INVENTION

1. Field of The Invention

The present invention relates generally to a semiconductor device. More specifically, the invention relates to the structure of a semiconductor device which has an improved integration degree by improving the planarization of the device and the alignment precision during the production thereof.

2. Related Background Art

In order to scale down semiconductor devices, it is important to flatten the surfaces of semiconductor wafers and to improve the alignment precision between fabricating steps.

Figure 6A:
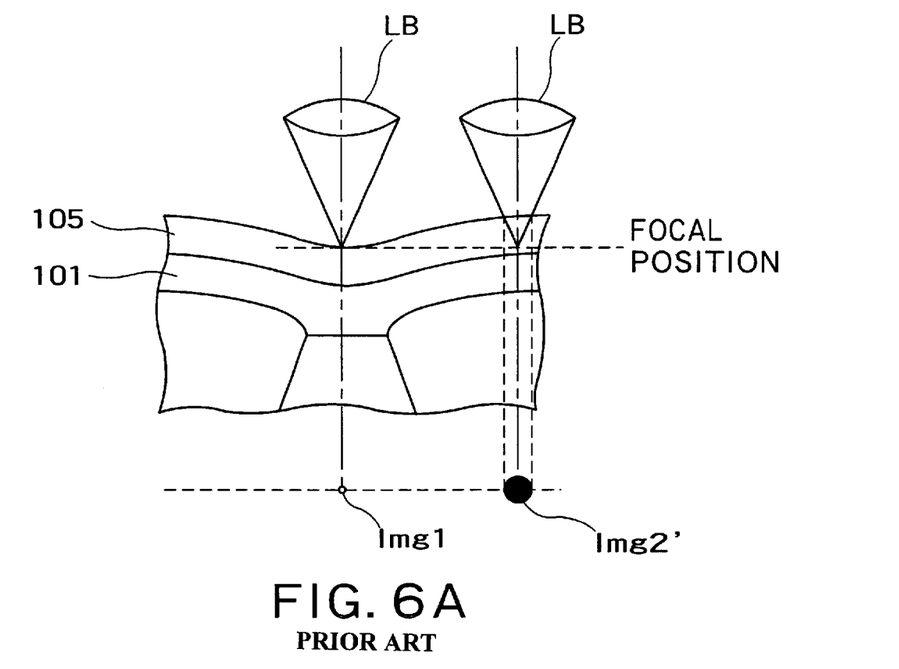
FIGS. 6A and 6B are schematic sectional views for explaining the need for flattening the surface of a semiconductor device.
Figure 6B:
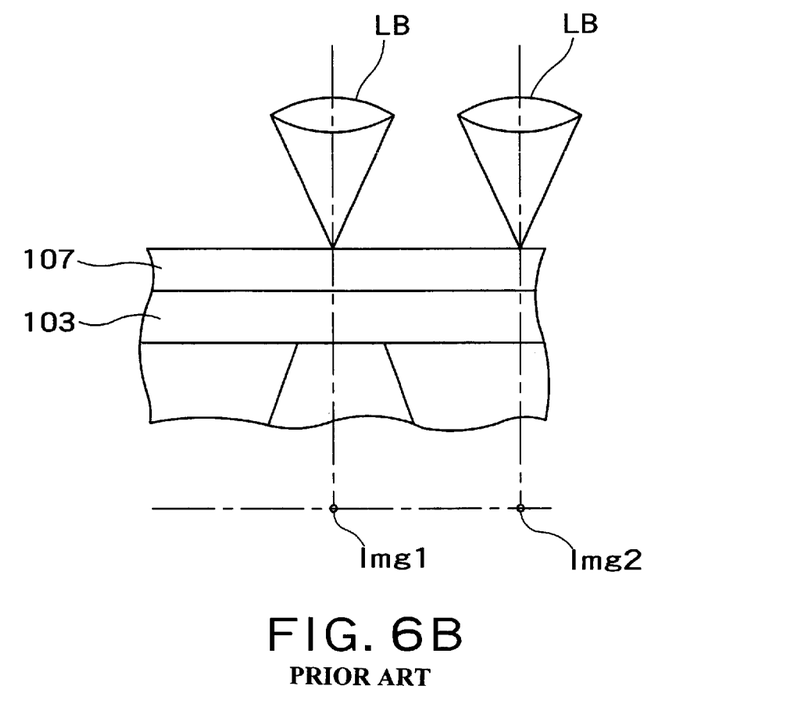

For example, as shown in FIG. 6A, if an underlayer 101, on which a pattern is to be transferred, has a difference in level at a lithography step for fabricating a semiconductor device, a resist film 105 also has a difference in level, so that the focal position of exposure beams LB for transferring a pattern fluctuates. For example, if the focal position of exposure beams LB is matched with the portion having the difference in level, a normal pattern image Img1 can be obtained thereon. However, the focal position is shifted on a flat portion so as not to normally form an image thereon, so that a transferred pattern image Img2' is a pattern image which is out of focus. For that reason, if an underlayer pattern has a large number of differences in level, a fine pattern can not be transferred. Therefore, in order to obtain normal pattern images in all of regions to be transferred, it is necessary to flatten an underlayer pattern 103 as flat as possible as shown in, e.g., FIG. 6B before the lithography step.

As planarization techniques, the chemical mechanical polishing (which will be hereinafter referred to as the "CMP") technique is widely used in recent years. The CMP is a technique for applying a fine abrasive material on the surface of a wafer to mechanically polish the surface thereof.

However, in the polishing using the CMP, it is required to lubricatively supply the abrasive material between a smooth polishing plate and the surface of the wafer and to rapidly discharge polished waste materials from the surface of the wafer after the polishing. Therefore, when a large pattern is polished or when polishing is carried out in a wide area between patterns, the adhesion between the polishing plate and the surface of the wafer is too high, so that the supply of the abrasive material and the discharge of the polished waste materials are obstructed. For that reason, it is difficult to carry out a good polishing. In addition, if a pattern, only a small part of which has a protruding portion, is polished, the polishing force concentrates on the protruding pattern, so that the polishing rate remarkably increases, thereby being difficult to control the quantity of polished materials. For that reason, in order to improve the polishing precision using the CMP, the maximum size of a pattern to be polished and the ratio of irregularities must be appropriately set.

Therefore, it is important to closely arrange patterns while adjusting the ratio of irregularities of the patterns.

Figure 7A:
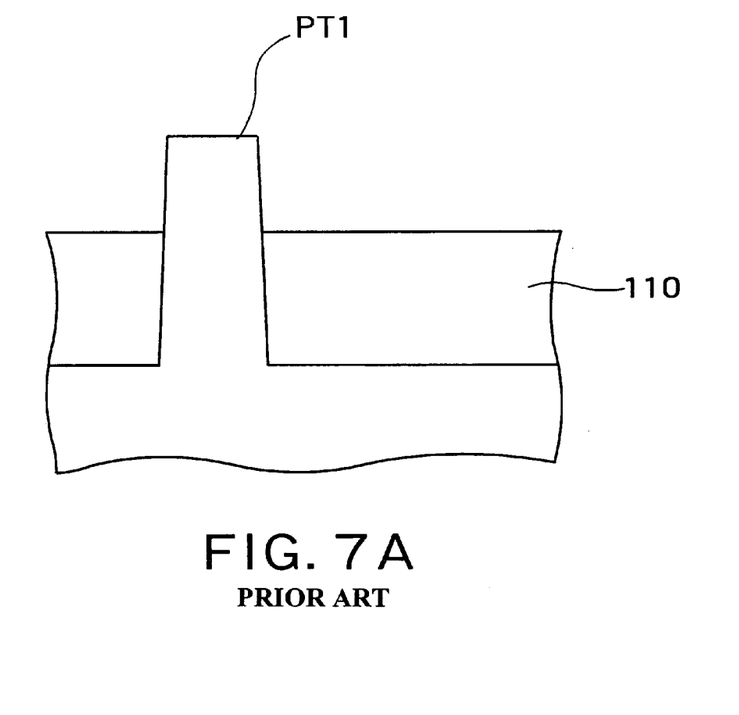
FIGS. 7A and 7B are schematic sectional views for explaining the need for closely arranging patterns.
Figure 7B:
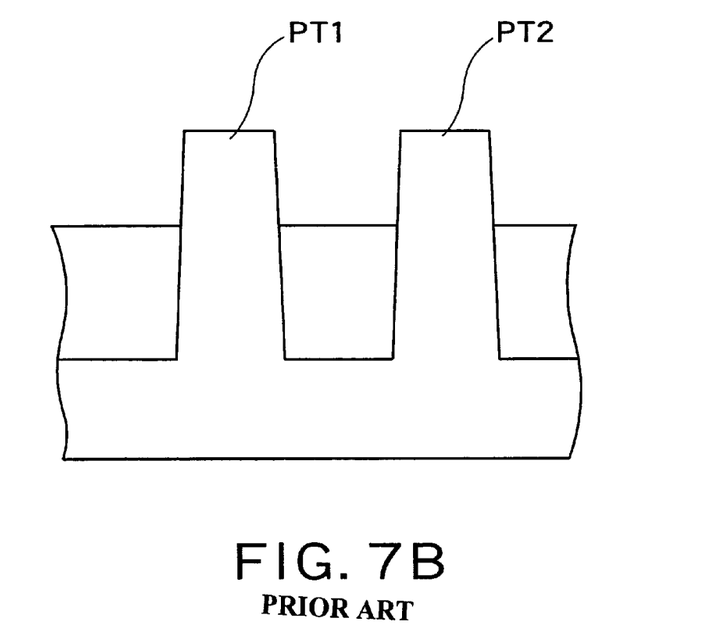

FIGS. 7A and 7B are schematic sectional views for explaining the need for closely arranging patterns on the surface of a wafer. As shown in FIG. 7A, when only one transistor is intended to be formed, only a transistor forming pattern PT1 protrudes with respect to a surrounding wide element isolating region 110. However, as shown in FIG. 7B, if a pattern PT2 is arranged so as to be close to the pattern PT1 the ratio of protruding portions in the surface region, so that it is possible to set an appropriate quantity for processing.

A conventional aligning method between fabricating steps will be described below.

Figure 8A:
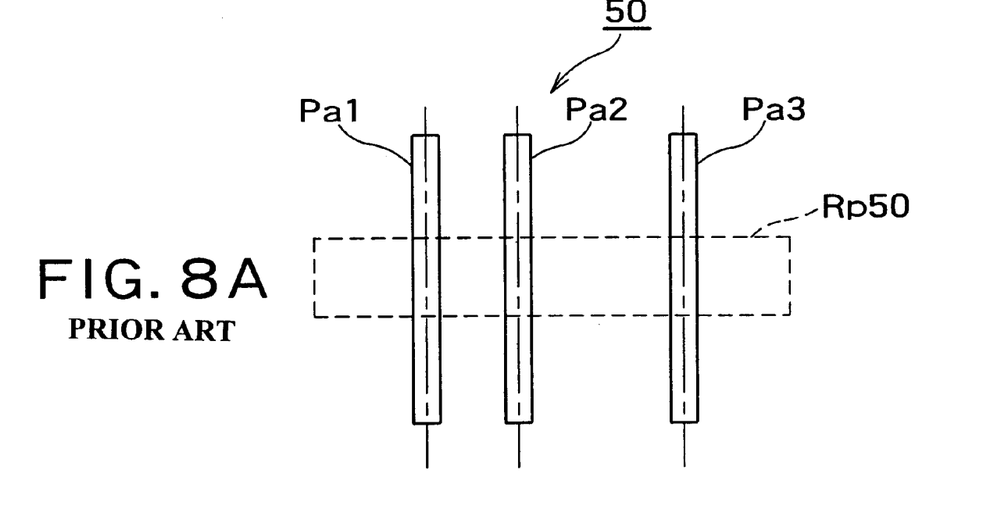
FIGS. 8A and 8B are illustrations for explaining an example of a conventional aligning method.

FIG. 8A is an illustration for explaining a conventional aligning method. Furthermore, in the following drawings, the same reference numbers are given to the same portions, and the detailed descriptions thereof are omitted.

Figure 8B:
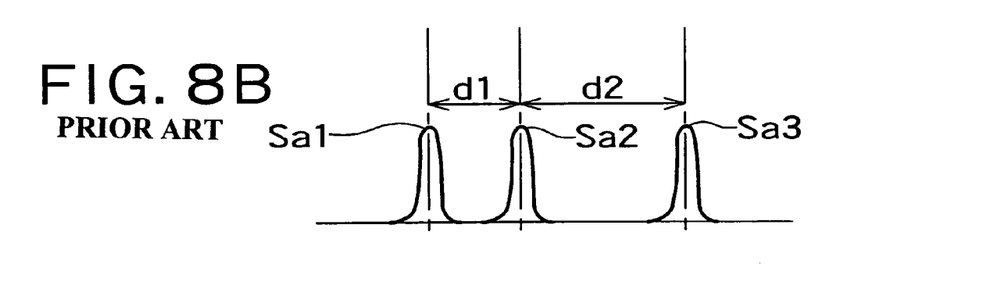

An alignment mark 50 includes three linear patterns Pa1 through Pa3 which are arranged in parallel to each other. With respect to these linear patterns, an optical image using an optical microscope or an electron diffraction image using a scanning electron microscope is acquired in a range extending perpendicularly to the respective lines as shown in a region Rp50, to obtain light intensities or electron beam intensities, a profile of FIG. 8B is obtained. It can be seen from FIG. 8B that an intensity distribution corresponding to the arrangement of the respective patterns Pa1 through Pa3 is obtained. Defining the intensity peaks corresponding to the patterns Pa1 through Pa3 as Sa1 through Sa3, respectively, defining the distance between the patterns Sa3 and Sa1 as d1 and defining the distance between the patterns Sa3 and Sa3 as d2, these distances correspond to pitches between the respective patterns, respectively. When three lined-up peaks, the distances between which are d1 and d2 in order from the left in FIG. 8B, are observed, if it is previously registered in a pattern recognition system that the central peak is set as the origin in alignment, it is possible to carry out an alignment between the current step and the last step.

In order to carry out the CMP of a device including alignment marks shown in FIG. 8A, it is difficult to apply the CMP with respect to both of a too broad pattern and a too wide space, some pattern must be arranged around the alignment marks.

Figure 9A:
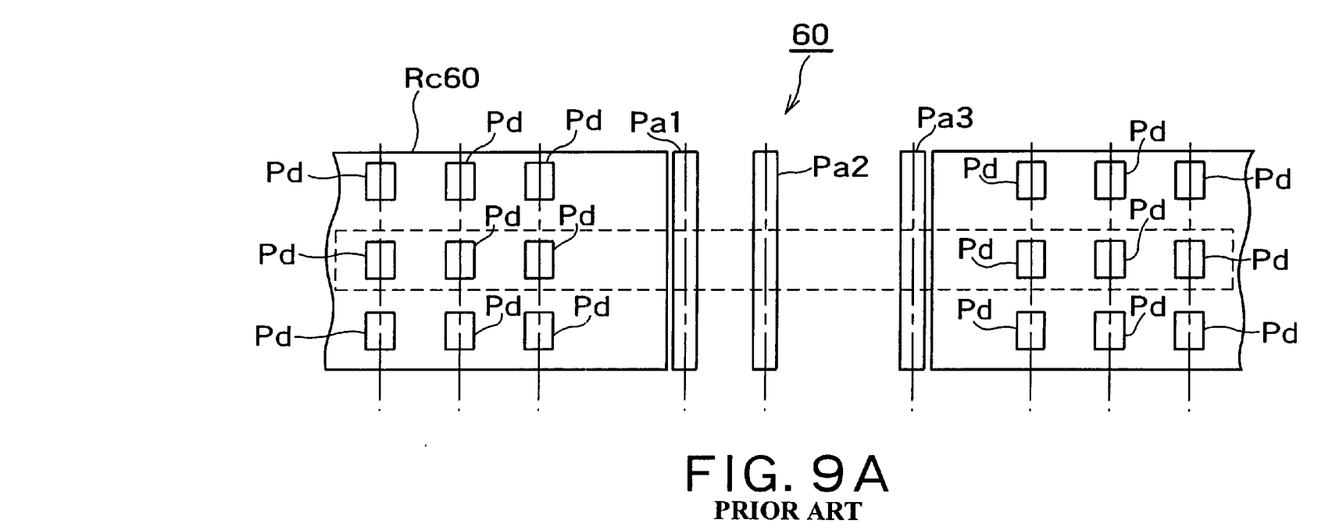
FIGS. 9A and 9B are illustrations for explaining another example of a conventional aligning method.

FIG. 9A shows an example of a semiconductor device in which patterns including such a CMP processing dummy pattern are arranged. The dummy pattern is arranged for the main purpose of improving the CMP processing precision, and plays little part in the operation of the device. Furthermore, in place of the dummy pattern, a pattern playing some part in the operation of the device may be arranged to enhance the CMP processing precision.

In a semiconductor device shown in FIG. 9A, dummy patterns Pd are arranged from a position, which is spaced from the line patterns Pa1 in an alignment mark 60 by a distance d2, in a region Rc60 having an appropriate set size, and periodically arranged in a cycle d1 in lateral directions of the figure.

Figure 9B:
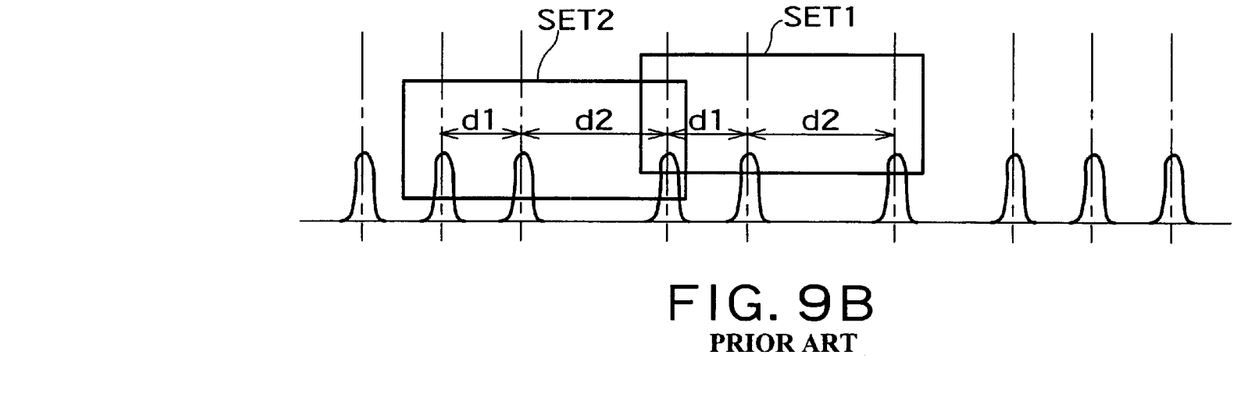

If the light intensity or electron beam intensity of the patterns is derived in the same manner as the method shown in FIG. 8B, a profile of FIG. 9B is obtained. A combination of three lined-up peaks, the distances between which are d1 and d2 in order from the left of the figure, is extracted from a profile of FIG. 9B, it is possible to fine two combinations, i.e., a combination SET1 based on the original alignment mark 60, and a combination SET2 based on the dummy patterns and a part of the alignment mark 60. This shows that there is some possibility that the origin is set at an erroneous place, such as the SET2, if the alignment is carried out using the pattern arrangement shown in FIG. 9A. This causes a problem in that the alignment precision is remarkably deteriorated.

Although false recognition from the surrounding dummy patterns can be prevented if the alignment marks are further complicated, the recognizing procedure is more complicated than the procedure for identifying the alignment mark itself, so that the costs of the identifying system are increased and the alignment rate is decreased, thereby increasing the whole manufacturing costs.

SUMMARY OF THE INVENTION

It is therefore an object of the present invention to eliminate the aforementioned problems and to provide a semiconductor device capable of improving an alignment precision while further developing the scale down of a device by flattening the device.

According to a first aspect of the present invention, there is provided a semiconductor device comprising: first patterns for alignment which are arranged in a first region on the surface of a semiconductor substrate, the first patterns including (n+1) first patterns (n is a natural number) in at least a first direction; and second patterns which are formed in a second region on the surface of the semiconductor substrate, the second region extending outwardly from the first region in the first direction, the second patterns including a plurality of patterns in a period of dD in at least the first direction, wherein defining a size of a pitch between adjacent two of the first patterns in the first direction as dk ($1 \leq k \leq n$), defining a coefficient depending on a precision in pattern recognition in the first direction as $\alpha$ ($1 > \alpha > 0$), and defining a distance between one of the first pattern which is closest to the second region in the first direction and the outside edge of the second region as D, the second region is set so as to satisfy the following relational expression, $$D \leq \sum_{k=1}^{n} dk$$

and the dD is set so as to satisfy the following relational expression with respect to optional dk.

$$|(dD-dk)/dk| \geq \alpha$$

According to the semiconductor device, the period dD of the second patterns is set so as to be shifted from each pitch between the first patterns by a predetermined margin, so that it is possible to prevent patterns other than an alignment mark from being erroneously recognized as the alignment mark in the pattern recognition for alignment between fabricating steps while giving the density of irregularities suitable for the CMP processing or the like to the surface of a wafer. Thus, according to the present invention, it is possible to improve the alignment precision between fabricating steps while advancing the scale down of a semiconductor device due to the planarization of the device.

According to a second aspect of the present invention, there is provided a semiconductor device comprising: first patterns for alignment which are arranged in a first region on the surface of a semiconductor substrate, the first patterns including (n+1) first patterns (n is a natural number) in at least a first direction; and second patterns which are formed in a second region on the surface of the semiconductor substrate, the second region extending outwardly from the first region in the first direction, the second patterns including m second patterns (m is a natural number) which are non-periodically arranged in at least the first direction, wherein defining a size of a first pitch between adjacent two of the first patterns in the first direction as dk ($1 \leq k \leq n$), defining a second pitch between one of the first patterns and one of the second patterns, which are closest to each other between the first region and the second region, in the first direction as dm, defining a size of a third pitch between adjacent two of the second patterns in the first direction as d(m-1) when $m \geq 2$, defining a coefficient depending on a precision in pattern recognition as $\alpha$ ($1 > \alpha > 0$), and defining a distance between one of the first pattern, which is closest to the second region in the first direction, and the outside edge of the second region as D, the second region is set so as to satisfy the following relational expression, $$D \leq \sum_{k=1}^{n} dk$$

and the dm is set so as to satisfy the following relational expression with respect to a combination of the dm with optional dk.

$$|(dm-dk)/dk| \geq \alpha$$

According to the second aspect of the present invention, any pitches between the second patterns are set so as to be shifted from each pitch between the first patterns by a predetermined margin, so that it is possible to prevent patterns other than the alignment mark from being erroneously recognized as the alignment mark in the pattern recognition for alignment even if the second patterns are non-periodic patterns. Thus, it is possible to improve the alignment precision between fabricating steps while advancing the scale down of a semiconductor device due to the planarization of the device.

The second patterns may be line patterns continuously arranged in a second direction perpendicular to the first direction.

In the first and second aspect of the invention, the semiconductor device may preferably further comprise third patterns arranged in a third region on the surface of the semiconductor substrate, the third region extending outwardly from the second region in the first direction, and the third patterns including patterns formed at a different pitch from that between the second patterns in at least the first direction and having a different shape from that of the second patterns.

According to a third aspect of the present invention, there is provided a semiconductor device comprising: first patterns for alignment which are arranged in a first region on the surface of a semiconductor substrate, the first patterns including (n+1) first patterns (n is a natural number) in at least a first direction; and second patterns which are formed in a second region on the surface of the semiconductor substrate and which are linear patterns arranged continuously in the first direction, the second region extending outwardly from the first region in the first direction, wherein defining a size of a pitch between adjacent two of the first patterns in the first direction as dk ($1 \leq k \leq n$), and defining the size of the second pattern in the first direction as S, the second region is set so as to satisfy the following relational expression.

$$S \geq \sum_{k=1}^{n} dk$$

According to the third aspect of the present invention, continuous patterns having no period in the first direction in the second region are arranged, so that it is possible to prevent patterns other than the alignment mark from being erroneously recognized as the alignment mark in the pattern recognition for alignment between fabricating steps while giving the density of irregularities suitable for the CMP processing to the surface of a wafer. Thus, it is possible to improve the alignment precision between fabricating steps while advancing the scale down of a semiconductor device due to the planarization of the device.

It is preferable in the third aspect of the invention, the semiconductor device further comprises third patterns which includes a plurality of patterns formed in at least the first direction in a third region on the surface of the semiconductor substrate, the third region extending outwardly from the second region in the first direction, the third patterns being arranged at a different pitch from a pitch between one of the first patterns and one of the third patterns, which are closest to each other between the first region and the third region, in the first direction, and the third patterns having a different shape from that of the second patterns.

According to a fourth aspect of the present invention, there is provided a semiconductor device comprising: first patterns for alignment which are arranged in a first region on the surface of a semiconductor substrate, the first patterns including (n+1) first patterns (n is a natural number) in at least a first direction; and second patterns which are arranged in a second region on the surface of the semiconductor substrate, the second region extending outwardly from the first region in the first direction, the second patterns including at least m pattern groups (m is a natural number) arranged repeatedly in at least the first direction, each of the pattern group being constituted with a unit of a combination of third patterns formed in a third region, the third region being included in the second region wherein defining a pitch between adjacent two of the first patterns in the first direction as dk ($1 \leq k \leq n$), defining the size of the third region in the first direction as dD, defining a distance between one of the first patterns, which is closest to the second region in the first direction, and the outside edge of the second region as D, and defining a coefficient depending on a precision in pattern recognition in the first direction as $\alpha$ ($1 > \alpha > 0$), the second region is set so as to satisfy the following relational expression, $$D \leq \sum_{k=1}^{n} dk$$

and the dD is set so as to satisfy the following relational expression with respect to optional dk.

$|(dD-dk)/dk| \geq \alpha$

According to the fourth aspect of the present invention, even if pattern groups of complicated patterns are arranged in the second region, when these patterns are repeatedly arranged, defining the size of the third region, where the repeated units of pattern groups are formed in the first direction, as dD, this dD is set so as to be shifted from each pitch between the first patterns by a predetermined margin. Thus, it is possible to improve the alignment precision while giving the density of irregularities suitable for the CMP processing or the like to the surface of a wafer.

In the fourth aspect of the invention, it is preferable that the semiconductor device further comprises fourth patterns including a plurality of patterns arranged at a pitch, which is different from the dD, in at least the first direction in a fourth region on the surface of the semiconductor substrate, the fourth region extending outwardly from the second region in the first direction, and the fourth patterns having a different shape from those of the third patterns of the unit.

The first patterns may be rectangular patterns which are repeatedly formed periodically in a second direction perpendicular to the first direction or may be line patterns continuously arranged in a second direction perpendicular to the first direction.

Moreover, $\alpha$ is preferably 0.1.

The first direction means a recognizing direction when patterns are recognized using light beams or charged particle beams.

In the above described semiconductor device, the first patterns, the second patterns and the third patterns include both of element forming patterns and dummy patterns which do not participate in the formation of elements.

The size of the second patterns, the period of the second patterns in the second direction, and the spacing between the second patterns in the second direction may be suitably selected for the CMP processing.

Similarly, the size of the third patterns, the period of the third patterns in the second direction, and the spacing between the third patterns in the second direction may be suitably selected for the CMP processing.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, some preferred embodiments of the present invention will be described below.

(1) First Preferred Embodiment

Figure 1A:
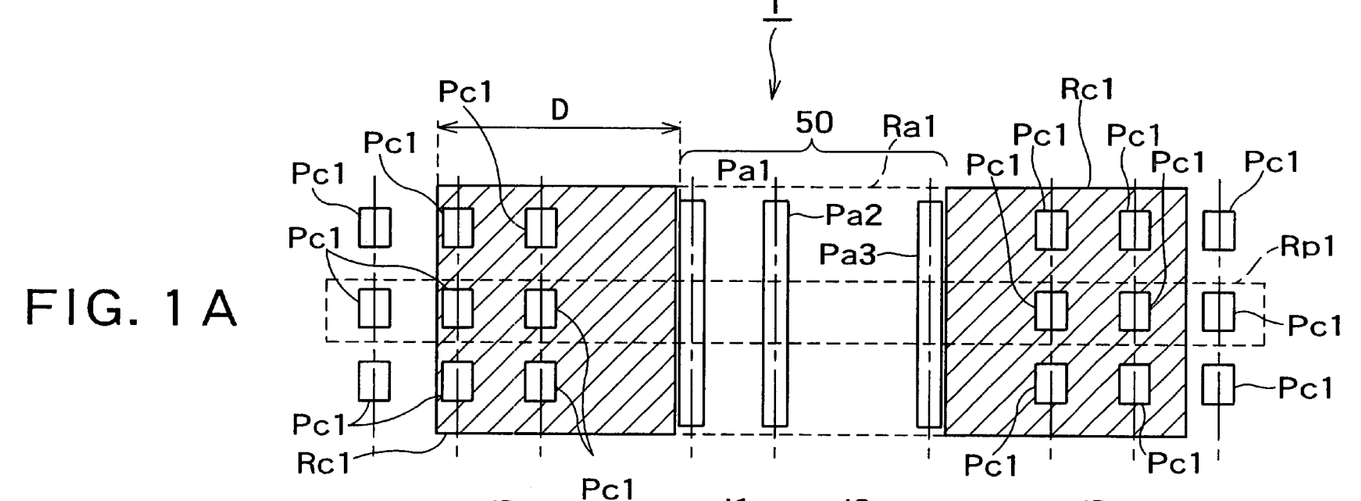
FIG. 1A is a plan view showing a principal part of the first preferred embodiment of a semiconductor device according to the present invention.
Figure 1B:
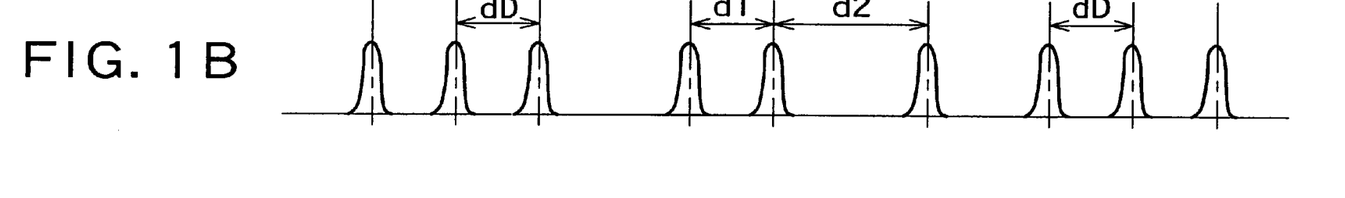
FIG. 1B is a diagram showing a light intensity profile or electron beam intensity profile which is obtained by irradiating a region Rp1 of the semiconductor device of FIG. 1 with light beams or electron beams.

FIGS. 1A and 1B are illustrations for explaining the first preferred embodiment of a semiconductor device according to the present invention. FIG. 1A is a plan view showing a principal part of a semiconductor device 1 in this preferred embodiment, and FIG. 1B shows a light intensity profile or electron beam profile which is obtained by irradiating a region Rp1 of FIG. 1A with light beams or electron beams.

As shown in FIG. 1A, the semiconductor device 1 in this preferred embodiment comprises an alignment mark 50 shown in FIG. 8A, and rectangular patterns Pc1 which are periodically arranged so as to form matrixes facing each other via the alignment mark 50. The row directions of the matrixes are directions perpendicular to line patterns Pa1 through Pa3, and the column directions of the matrixes are directions parallel to the line patterns Pa1 through Pa3 in the alignment mark 50. In this preferred embodiment, the rectangular patterns Pc1 extending in the row directions of the matrixes are arranged so as to be positioned on the same line with respect to the facing matrixes. The rectangular patterns Pc1 are arranged in order to enhance of the density of irregularities on the surface of a wafer for the CMP processing or the like. Therefore, the rectangular patterns Pc1 may be patterns playing some part in the operation of the device, such as wiring patterns, or may be patterns which are formed only for the CMP processing or the like and which do not function in the operation of the device. This point is the same in preferred embodiments which will be described later.

The size (lengths of long and short sides) of each of the rectangular patterns Pc1, the period in the column directions, the spacing between adjacent patterns are set to be values suitable for the processing such as the CMP.

As shown in FIG. 1B, defining the repeated period in the row directions of the rectangular patterns Pc1 as dD and defining a region, in which the distance D between the line pattern Pa1 in the alignment mark 50 and the outside edge is within (d1+d2), as a mark proximity region Rc1, then, the repeated period dD in at least the mark proximity region Rc1 simultaneously satisfies the following relational expressions including a coefficient α (1>α>0):

$$|(dD-d1)/d1| \geq \alpha$$

$$|(dD-d1)/d2| \geq \alpha$$

wherein α is a coefficient depending on the precision of pattern recognition in a pattern recognition system. In the present circumstances, it has been empirically revealed that α=1 is optimum. This point is the same in the preferred embodiments which will be described later.

According to the semiconductor device 1 in this preferred embodiment, the repeated period dD of the rectangular patterns Pc1 in directions perpendicular to the line patterns constituting the alignment mark is set so as to be shifted from the respective pitches between the line patterns Pa1, Pa2 and Pa3 by a predetermined margin. Thus, the density of irregularities suitable for the CMP processing or the like can be given to the surface of the wafer, and it is possible to prevent patterns other than the alignment mark from being erroneously recognized as the alignment mark in the pattern recognition for the alignment between fabricating steps. As a result, it is possible to realize a smooth CMP processing and to improve the alignment precision.

While the alignment mark 50 having the same three line patterns as those in the conventional device has been used in the semiconductor device 1 shown in FIG. 1, the alignment mark capable of being arranged in a semiconductor device according to the present invention should not be limited thereto. For example, an alignment mark formed by two line patterns, or an alignment mark formed by four or more line patterns can also realize a high precision alignment by carrying out the same setting as the above described setting.

That is, in an alignment mark in which n+1 patterns are arranged to be formed, the pitches between adjacent patterns are defined as d1, d2, . . . , dn, respectively and a region, in which the distance between the pattern closest to the alignment mark therein and the outside edge is within (d1+d2+ . . . +dn), is defined as a mark proximity region Rc. Then, it is possible to prevent patterns other than the alignment mark from being erroneously recognized as the alignment pattern if a period dD is set so that m patterns repeatedly formed at the period dD in a pattern recognizing direction during alignment in at least the mark proximity region Rc satisfy the following expression with respect to an optional dk (1≧k≧n).

$$|(dD-dk)/dk| \geq \alpha \tag{1}$$

The shape of the patterns constituting the alignment mark should not be limited to that of the line patterns shown in FIG. 1A, but it may be rectangular or another shape.

Figure 2A:
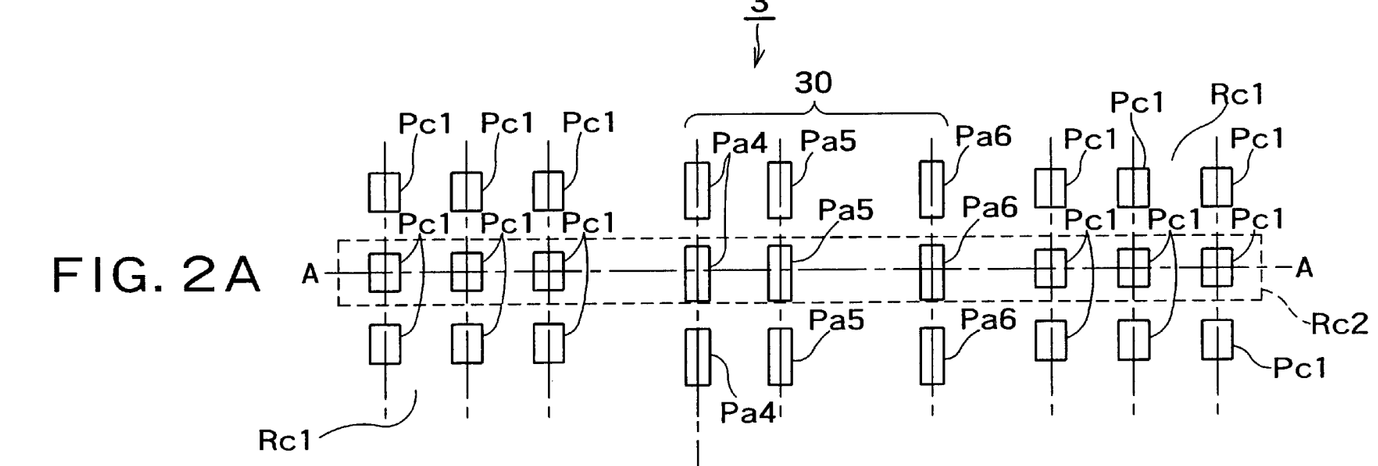
FIG. 2A is a plan view showing a principal part of a modified example of the semiconductor device shown in FIG. 1A.
Figure 2B:
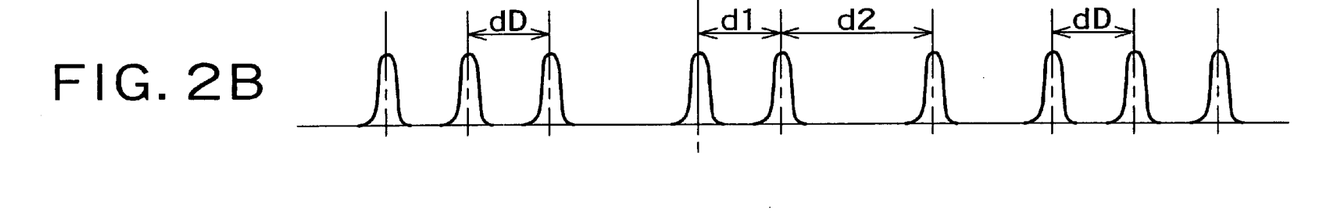
FIG. 2B is a diagram showing a light intensity profile or electron beam intensity profile which is obtained by irradiating a region Rp2 of the semiconductor device of FIG. 2A with light beams or electron beams.

FIG. 2A is a plan view showing a principal part of a modified example of the semiconductor device 1 shown in FIG. 1A, and FIG. 2B shows a light intensity profile or electron beam intensity which is obtained by irradiating a region Rp2 of FIG. 2A with light beams or electron beams.

As can be clearly seen from the comparison with FIG. 1A, a semiconductor device 3 shown in FIG. 2A comprises an alignment mark 30 including rectangular patterns Pa4 which are arranged at a predetermined period in column directions. Also with respect to such an alignment mark, if a period dD is set so that the above described relational expression (1) is satisfied with respect to line A—A taken along a pattern recognizing direction during alignment as shown by a stripe-like region Rp3, it is possible to carry out an alignment without erroneous recognition.

With respect to CMP processing patterns which are arranged on both sides of the alignment mark, there are some cases where more complicated patterns must be arranged in accordance with the design specification of the device.

Figure 3:
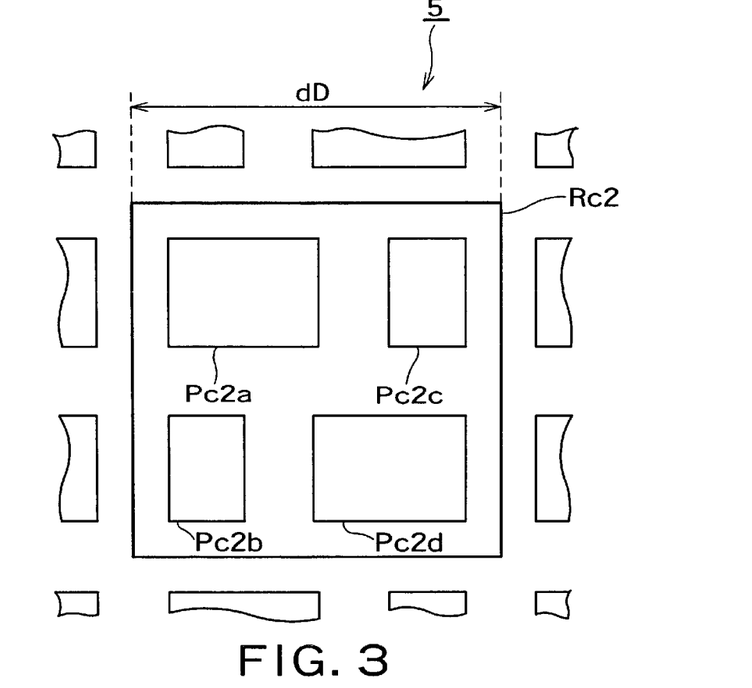
FIG. 3 is a plan view showing a principal part of another modified example of the semiconductor device shown in FIG. 1A.

FIG. 3 is a plan view showing a principal part of a semiconductor device 5 which is a modified example of the semiconductor device 1 shown in FIG. 1A. This figure shows CMP processing pattern groups Pc2 of the semiconductor device 5 in this modified example. Each of the pattern groups Pc2 comprises patterns Pc2a through Pc2d, which have different shapes and sizes, as a unit, and are repeatedly arranged so as to be spread all over a mark proximity region Rc1. Also with respect to such repeated patterns, defining the size of a region Rc2, in which the pattern Pc2 serving as a repeated unit is formed, in pattern recognizing directions (lateral directions in the figure) as dD, if the size dD is set so that the above described relational expression (1) is satisfied, it is possible to carry out an alignment without erroneous recognition.

(2) Second Preferred Embodiment

Referring to the accompanying drawings, the second preferred embodiment of a semiconductor device according to the present invention will be described below.

Figure 4:
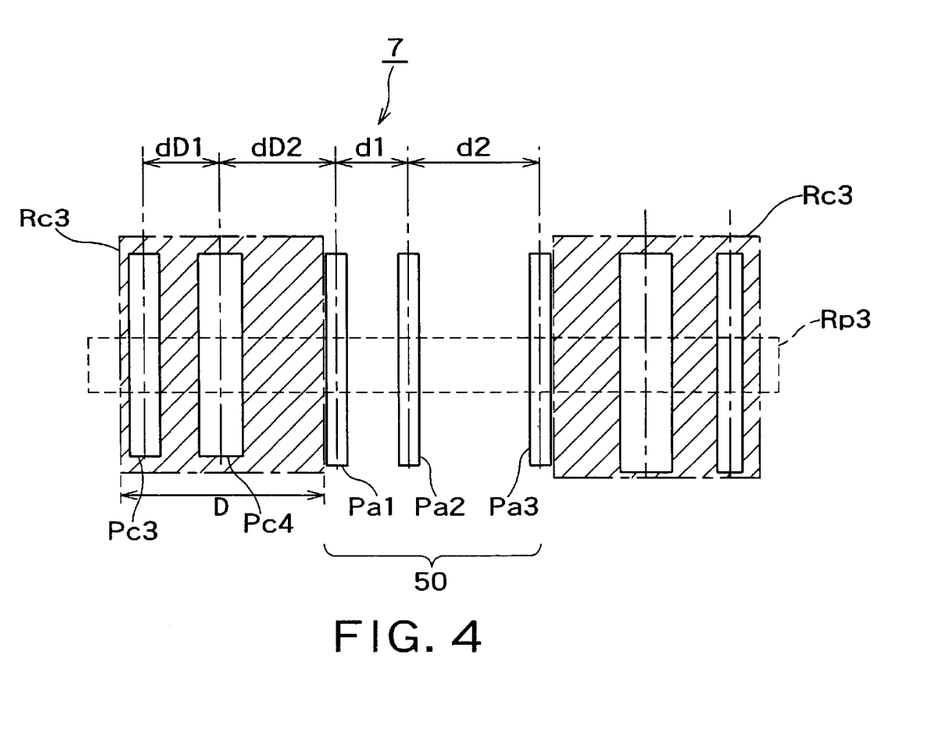
FIG. 4 is a plan view showing a principal part of the second preferred embodiment of a semiconductor device according to the present invention.

FIG. 4 is a plan view showing a principal part of a semiconductor device 7 in this preferred embodiment. As can be clearly seen from the comparison with the semiconductor device 1 shown in FIG. 1A, the feature of the semiconductor device 7 in this preferred embodiment is that line patterns Pc3 and Pc4 are formed so as to have a continuous linear shape in place of the rectangular patterns Pc1 of FIG. 1A. The line patterns Pc3 and Pc4 are arranged in order to enhance the density of irregularities on the surface of a wafer for the CMP processing or the like. The line patterns Pc3 and Pc4 may be patterns which play some part in the operation of the device, for example, wiring patterns or may be dummy patterns playing no part in the operation of the device.

The line patterns Pc3 and Pc4 have a long side having a length which is substantially equal to that of the line patterns Pa1 through Pa3 constituting an alignment mark 50, and are arranged in parallel to the line patterns Pa1 through Pa3. The length of each of the long and short sides of the line patterns Pc3 and Pc4 is set so as to be a value suitable for the CMP processing or the like similar to the above described first preferred embodiment.

Defining the pitch between the line patterns Pc3 and Pc4 as dD1, defining the pitch between the line pattern Pc4 and the line pattern Pa1 of the alignment mark as dD2 and defining a region, in which the distance between the line pattern Pa1 and the outside edge is within (d1+d2), as a mark proximity region Rc3, then, dD1 and dD2 are set so as to simultaneously satisfy the following expressions.

$|(dD1-d1)/d1| \geq \alpha$ $|(dD1-d2)/d2| \geq \alpha$ $|(dD2-d1)/d1| \geq \alpha$ $|(dD2-d2)/d2| \geq \alpha$ Thus, even in the case of linear patterns having no periodicity, if the respective pitches between the patterns Pc3 and Pc4 in the mark proximity region Rc3 are set at least so as to be shifted by a predetermined margin from any pitches between the line patterns Pa1, Pa2 and Pa3, the density of irregularities suitable for the CMP processing or the like can be given to the surface of the wafer, and it is possible to prevent patterns other than the alignment mark from being erroneously recognized as the alignment mark in the pattern recognition for alignment. As a result, it is possible to realize a smooth CMP processing and to improve the alignment precision.

Similar to the semiconductor device 3 shown in FIG. 2A, when the patterns constituting the alignment mark are fine rectangular patterns, it is possible to prevent erroneous recognition while giving the density of irregularities suitable for the CMP processing or the like to the surface of the wafer if conditions are set as follows.

That is, the number of line patterns, for use in the CMP processing or the like, in a direction perpendicular to a recognizing direction during alignment is defined as m, the number of line patterns in an alignment mark in this direction is defined as n+1, the pitch between the line patterns is defined as dk ($1 \leq k \leq n$) and the distance between the alignment mark and the line pattern closest thereto in the alignment mark is defined as D. Then, a region satisfying the following expression is defined as Rc, $$D \leq \sum_{k=1}^{n} dk$$

and the pitch between adjacent two of the line patterns, for use in the CMP processing or the like, in a recognizing direction during alignment is defined as d(m−1) and the pitch between the closest patterns between the region of the alignment mark and the mark proximity region Rc, e.g., the pitch between the line patterns Pa1 and Pc4 in the preferred embodiment shown in FIG. 4, is defined as dm. Then, with respect to an optional combination of dk with dm, dm is set so that the following expression is satisfied.

$|(dm-dk)/dk| \geq \alpha$

(3) Third Preferred Embodiment

Referring to the accompanying drawings, the third preferred embodiment of a semiconductor device according to the present invention will be described below.

Figure 5:
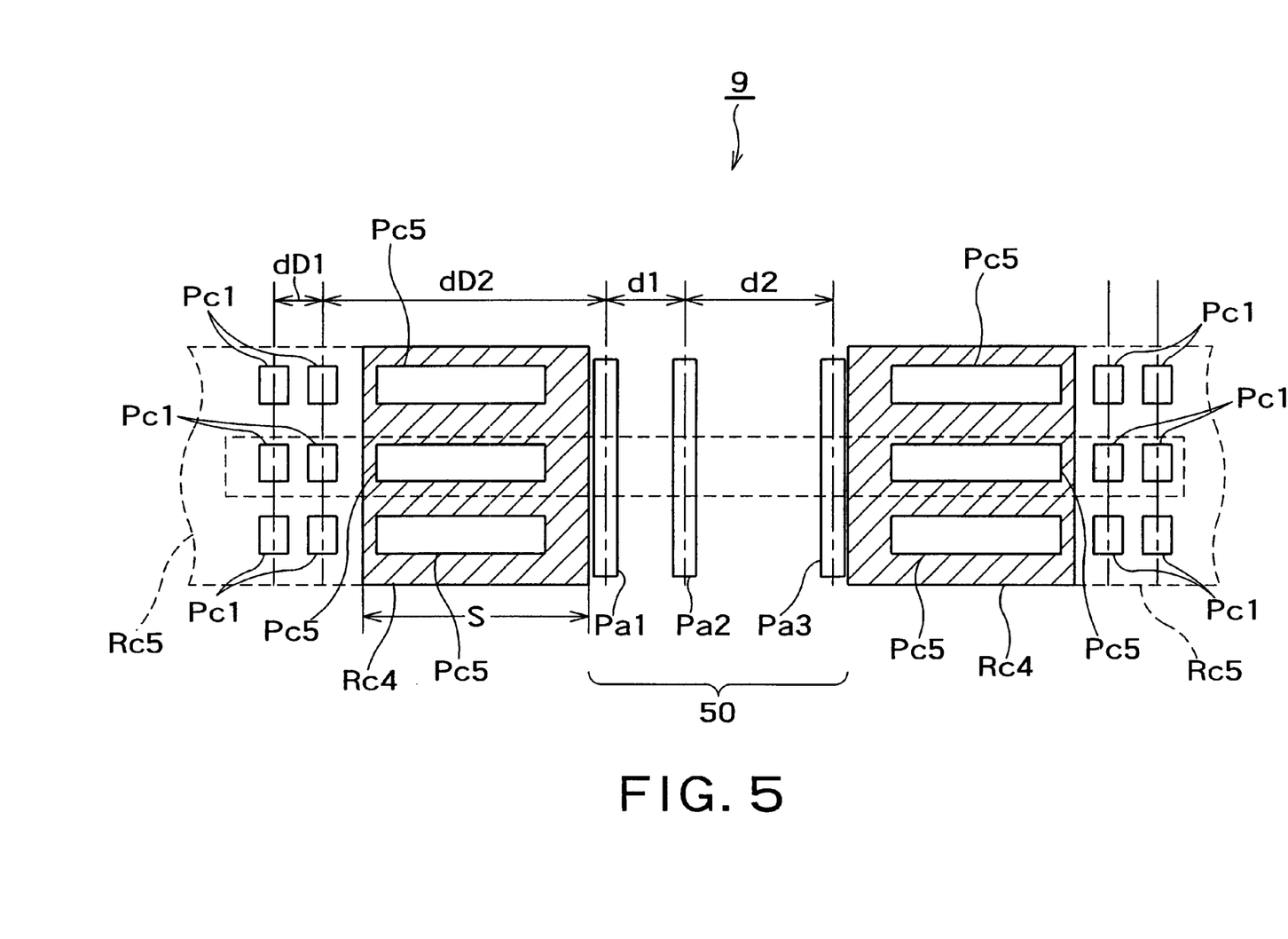
FIG. 5 is a plan view showing a principal part of the third preferred embodiment of a semiconductor device according to the present invention.

FIG. 5 is a plan view showing a principal part of a semiconductor device 9 in this preferred embodiment. As can be clearly seen from the comparison with the semiconductor device 1 shown in FIG. 1A, the semiconductor device 9 shown in FIG. 5 comprises continuous linear patterns Pc5 and rectangular patterns Pc1 in addition to an alignment mark 50. The patterns Pc5 and Pc1 are arranged in order to enhance the density of irregularities on the surface of a wafer for the CMP processing or the like. The patterns Pc5 and Pc1 may be patterns playing some part in the operation of the device, e.g., wiring patterns or may be dummy patterns playing no part in the operation of the device. Similar to the above described preferred embodiments, the lengths of long and short sides of the patterns Pc5 and Pc1, and the period or pattern spacing in directions perpendicular to a recognizing direction during alignment are set so as to be values suitable for the CMP processing or the like.

The line patterns Pc5 are arranged in a mark proximity region Rc4 so as to be parallel to a direction perpendicular to the line patterns Pa1 through Pa3 of the alignment mark 50, i.e., a recognizing direction during alignment. In this preferred third embodiment, the mark proximity region Rc4 is the same as those in the above described preferred embodiments in that the region Rc4 extends outwardly from the alignment mark 50 in the recognizing direction during alignment. However, in this preferred embodiment the size S of the mark proximity region Rc4 in the recognizing direction is set so as to be equal to or greater than (d1+d2).

The rectangular patterns Pc1 are periodically arranged so as to form a matrix in a region Rc5 which is positioned outside of the mark proximity region Rc4 viewed from the alignment mark 50 in the recognizing direction during alignment. The period dD1 of the rectangular patterns Pc1 in the recognizing direction during alignment is set so as to be different from a pitch dD2 between the line pattern Pa1 of the alignment mark and the rectangular pattern Pc1 closest thereto.

If the continuous patterns Pa5, which have no period in a direction perpendicular to the line patterns Pa1 constituting the alignment mark 50, are thus arranged as patterns in the alignment proximity region Rc4, the density of irregularities suitable for the CMP processing or the like can be given to the surface of the wafer, and it is possible to prevent patterns other than the alignment mark from being erroneously recognized as the alignment mark in the pattern recognition for alignment. Thus, it is possible to improve the alignment precision.

If the patterns Pc1 having a shape different from that of the patterns Pc5 are arranged outside the mark proximity regions Rc4 viewed from the alignment mark 50 and if the period dD1 in the recognizing direction during alignment is set so as to be different from the pitch dD2 between the line pattern Pa1 of the alignment mark 50 and the line pattern Pc1 closest thereto, it is possible to further improve the alignment precision.

While the periodic rectangular patterns have been arranged in the regions Rc5 outside of the mark proximity region in this preferred embodiment, the present invention should not be limited thereto, but non-periodic rectangular patterns may be arranged in the regions Rc5. Line patterns may also be arranged in the regions Rc5 in parallel to the line patterns Pa1 through Pa3 of the alignment mark 50 as shown in the semiconductor device 7 of FIG. 4.

While the alignment mark 50 having the same three line patterns as those in the conventional device has been used as the alignment mark in this preferred embodiment, it is possible to enhance the alignment precision by carrying out the same setting as that in the above described preferred embodiment even if another alignment mark is used. That is, in an alignment mark in which n+1 patterns are lined up, defining the pitches between adjacent patterns as d1, d2, ..., dn, respectively, and defining the region wherein the distance between the pattern closest to the alignment mark and the outside edge in the alignment mark is within (d1+d2+ ... +dn) as a mark proximity region Rc3', the patterns Pc5 are set so as to be continuous patterns in at least a direction perpendicular to the patterns of the alignment mark. Thus, it is possible to prevent patterns other than the alignment mark from being erroneously recognized as the patterns for alignment.

While some preferred embodiments of the present invention have been described above, the present invention should not be limited to the above described preferred embodiment, but the invention can be modified in various ways without departing from the principle of the invention. For example, in only the above described third preferred embodiment, it has been described that the patterns having different shape, size and period from those of patterns in the mark proximity region are arranged in the region outside of the mark proximity region Rc4 viewed from the alignment mark 50. However, the present invention should not be limited thereto. Of course, it is possible to improve the precision during alignment if such patterns are further arranged in the above described first and second preferred embodiments. In addition, while the alignment mark has included the patterns non-periodically arranged in the recognizing direction during alignment in the above described preferred embodiment, the present invention should not be limited thereto, but the present invention may be applied to a case where the alignment mark comprises periodically arranged patterns.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
    first patterns for alignment which are arranged in a first region on the surface of a semiconductor substrate, said first patterns including (n+1) first patterns (n is a natural number) in at least a first direction; and
    second patterns which are formed in a second region on the surface of the semiconductor substrate, said second region extending outwardly from said first region in said first direction, said second patterns including a plurality of patterns in a period of dD in at least said first direction,
    wherein defining a size of a pitch between adjacent two of said first patterns in said first direction as dk ($1 \leq k \leq n$),
    defining a coefficient depending on a precision in pattern recognition in said first direction as α ($1 > α > 0$), and
    defining a distance between one of said first pattern which is closest to said second region in said first direction and the outside edge of said second region as D,
    said second region is set so as to satisfy the following relational expression, $$D \leq \sum_{k=1}^{n} dk$$

and said dD is set so as to satisfy the following relational expression with respect to optional dk $$|(dD-dk)/dk| \geq α.$$

2. A semiconductor device according to claim 1, wherein said second patterns are line patterns continuously arranged in a second direction perpendicular to said first direction.

3. A semiconductor device according to claim 1, wherein said second patterns are formed so as to be periodically repeated in a second direction perpendicular to said first direction.

4. A semiconductor device according to claim 3, which further comprises third patterns arranged in a third region on the surface of the semiconductor substrate, said third region extending outwardly from said second region in said first direction, and said third patterns including patterns formed at a different pitch from that between said second patterns in at least said first direction and having a different shape from that of said second patterns.

5. A semiconductor device according to claim 4, wherein said first patterns are rectangular patterns which are repeatedly formed periodically in said second direction perpendicular to said first direction.

6. A semiconductor device according to claim 4, wherein said first patterns are line patterns continuously arranged in said second direction perpendicular to said first direction.

7. A semiconductor device comprising:
    first patterns for alignment which are arranged in a first region on the surface of a semiconductor substrate, said first patterns including (n+1) first patterns (n is a natural number) in at least a first direction; and
    second patterns which are formed in a second region on the surface of the semiconductor substrate, said second region extending outwardly from said first region in said first direction, said second patterns including m second patterns (m is a natural number) which are non-periodically arranged in at least said first direction, wherein defining a size of a first pitch between adjacent two of said first patterns in said first direction as dk ($1 \leq k \leq n$), defining a second pitch between one of said first patterns and one of said second patterns, which are closest to each other between said first region and said second region, in said first direction as dm, defining a size of a third pitch between adjacent two of said second patterns in said first direction as d(m−1) when $m \geq 2$, defining a coefficient depending on a precision in pattern recognition as α ($1 > \alpha > 0$), and defining a distance between one of said first pattern, which is closest to said second region in said first direction, and the outside edge of said second region as D, said second region is set so as to satisfy the following relational expression, $$D \leq \sum_{k=1}^{n} dk$$

and said dm is set so as to satisfy the following relational expression with respect to a combination of said dm with optional dk $$|(dm-dk)/dk| \geq \alpha.$$

8. A semiconductor device according to claim 7, wherein said second patterns are line patterns continuously arranged in a second direction perpendicular to said first direction.

9. A semiconductor device according to claim 7, wherein said second patterns are repeatedly formed periodically in a second direction perpendicular to said first direction.

10. A semiconductor device according to claim 9, which further comprises third patterns arranged in a third region on the surface of the semiconductor substrate, said third region extending outwardly from said second region in said first direction, and said third patterns being formed at a fourth pitch in at least said first direction and having a different shape from that of said second patterns, said fourth pitch being different from said third pitch.

11. A semiconductor device according to claim 10, wherein said first patterns are rectangular patterns which are repeatedly formed periodically in said second direction perpendicular to said first direction.

12. A semiconductor device according to claim 10, wherein said first patterns are line patterns continuously arranged in said second direction perpendicular to said first direction.

13. A semiconductor device comprising:

first patterns for alignment which are arranged in a first region on the surface of a semiconductor substrate, said first patterns including (n+1) first patterns (n is a natural number) in at least a first direction; and second patterns which are formed in a second region on the surface of the semiconductor substrate and which are linear patterns arranged continuously in said first direction, said second region extending outwardly from said first region in said first direction, wherein defining a size of a pitch between adjacent two of said first patterns in said first direction as dk ($1 \leq k \leq n$), and defining the size of said second pattern in said first direction as S, said second region is set so as to satisfy the following relational expression $$S \geq \sum_{k=1}^{n} dk.$$

14. A semiconductor device according to claim 13, which further comprises third patterns which includes a plurality of patterns formed in at least said first direction in a third region on the surface of the semiconductor substrate, said third region extending outwardly from said second region in said first direction, said third patterns being arranged at a different pitch from a pitch between one of said first patterns and one of said third patterns, which are closest to each other between said first region and said third region, in said first direction, and said third patterns having a different shape from that of said second patterns.

15. A semiconductor device according to claim 14, wherein said second patterns are repeatedly formed periodically in a second direction perpendicular to said first direction.

16. A semiconductor device according to claim 15, wherein said first patterns are rectangular patterns which are repeatedly formed periodically in said second direction perpendicular to said first direction.

17. A semiconductor device according to claim 15, wherein said first patterns are line patterns continuously arranged in said second direction perpendicular to said first direction.

18. A semiconductor device comprising:

first patterns for alignment which are arranged in a first region on the surface of a semiconductor substrate, said first patterns including (n+1) first patterns (n is a natural number) in at least a first direction; and second patterns which are arranged in a second region on the surface of the semiconductor substrate, said second region extending outwardly from said first region in said first direction, said second patterns including at least m pattern groups (m is a natural number) arranged repeatedly in at least said first direction, each of said pattern group being constituted with a unit of a combination of third patterns formed in a third region, said third region being included in said second region;

wherein defining a pitch between adjacent two of said first patterns in said first direction as dk ($1 \leq k \leq n$), defining the size of said third region in said first direction as dD, defining a distance between one of said first patterns, which is closest to said second region in said first direction, and the outside edge of said second region as D, and defining a coefficient depending on a precision in pattern recognition in said first direction as α ($1 > \alpha > 0$), said second region is set so as to satisfy the following relational expression, $$D \leq \sum_{k=1}^{n} dk$$

and said dD is set so as to satisfy the following relational expression with respect to optional dk $$|(dD-dk)/dk| \geq \alpha.$$

19. A semiconductor device according to claim 18, which further comprises fourth patterns including a plurality of patterns arranged at a pitch, which is different from said dD, in at least said first direction in a fourth region on the surface of the semiconductor substrate, said fourth region extending outwardly from said second region in said first direction, and said fourth patterns having a different shape from those of said third patterns of said unit.

20. A semiconductor device according to claim 19, wherein said first patterns are rectangular patterns which are repeatedly formed periodically in a second direction perpendicular to said first direction.

21. A semiconductor device according to claim 19, wherein said first patterns are line patterns continuously arranged in a second direction perpendicular to said first direction.

* * * * *